(12) United States Patent
Arnold et al.

(10) Patent No.: US 7,777,175 B2
(45) Date of Patent: Aug. 17, 2010

(54) TOUCH-SENSITIVE MOMENTARY-CONTACT SWITCH AND OPERATING DEVICE HAVING AT LEAST ONE TOUCH-SENSITIVE MOMENTARY-CONTACT SWITCH

(75) Inventors: Georg Arnold, Schwabach (DE); Johann Wolf, Fürth (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 0 days.

(21) Appl. No.: 12/333,527

(22) Filed: Dec. 12, 2008

(65) Prior Publication Data

US 2009/0152451 A1 Jun. 18, 2009

(51) Int. Cl.
*G06M 7/00* (2006.01)
(52) U.S. Cl. ..................................... 250/221
(58) Field of Classification Search ................ 250/221, 250/227.22, 227.23; 345/175
See application file for complete search history.

(56) References Cited

U.S. PATENT DOCUMENTS

| 4,868,551 | A | 9/1989 | Arditty et al. |
| 7,355,164 | B2 | 4/2008 | Arnold |
| 2002/0020808 | A1 | 2/2002 | Kado |
| 2005/0162381 | A1* | 7/2005 | Bell et al. ................ 345/156 |

FOREIGN PATENT DOCUMENTS

| DE | 40 07 971 A1 | 9/1991 |
| DE | 198 51 505 A1 | 5/2000 |
| DE | 198 56 008 A1 | 6/2000 |
| DE | 202 15 326 U1 | 2/2004 |
| DE | 10 2004 025 878 B4 | 12/2005 |
| DE | 10 2005 021 008 A1 | 12/2005 |
| DE | 10 2004 053 496 A1 | 5/2006 |
| EP | 0 446 642 A1 | 9/1991 |
| EP | 0 759 660 A1 | 2/1997 |
| EP | 1 406 387 A1 | 4/2004 |

OTHER PUBLICATIONS

Cromar et al., "Touch control digital monitor", Jun. 1, 1993, IBM Technical Disclosure Bulletin, vol. 36 No. 06A, pp. 517-520.*

* cited by examiner

*Primary Examiner*—Thanh X Luu
(74) *Attorney, Agent, or Firm*—Laurence A. Greenberg; Werner H. Stemer; Ralph E. Locher

(57) ABSTRACT

A touch-sensitive momentary-contact switch includes an infrared-radiation-emitting transmitter, an infrared-radiation-receiving receiver and at least one visible-light-emitting signal element. The transmitter, receiver and signal element radiate into a single light-guiding element. Due to optical beam guidance, a separation of a transmission channel and a reception channel in the light-guiding element is effected in such a way that at a top-side area of the light-guiding element remote from the transmitter and the receiver, a superimposition of a region that can be irradiated by the transmitter and a region that can be detected by the receiver is produced only on a small portion of the area. An operating device for a domestic appliance including at least one touch-sensitive momentary-contact switch, is also provided.

12 Claims, 2 Drawing Sheets

TOUCH-SENSITIVE MOMENTARY-CONTACT SWITCH AND OPERATING DEVICE HAVING AT LEAST ONE TOUCH-SENSITIVE MOMENTARY-CONTACT SWITCH

CROSS-REFERENCE TO RELATED APPLICATION

This application claims the priority, under 35 U.S.C. §119, of German Patent Application DE 10 2007 060 293.8, filed Dec. 12, 2007; the prior application is herewith incorporated by reference in its entirety.

BACKGROUND OF THE INVENTION

Field of the Invention

The present invention relates to a touch-sensitive momentary-contact switch and in particular to such a momentary-contact switch for use in an operating device of a domestic appliance, including an infrared-radiation-emitting transmitter, an infrared-radiation-receiving receiver and at least one visible-light-emitting signal element. The transmitter, the receiver and the signal element radiate into a single light-guiding element. The invention also relates to an operating device having at least one touch-sensitive momentary-contact switch.

The basic construction and the basic principle of such a touch-sensitive momentary-contact switch are known from German Published, Non-Prosecuted Patent Application DE 40 07 971 A1, for example. That touch-sensitive momentary-contact switch has an electromagnetic-radiation-emitting transmitter and an electromagnetic-radiation-receiving receiver, which are disposed behind a covering that is at least partly transmissive to the electromagnetic radiation. One advantageous application of such touch-sensitive momentary-contact switches is, for example, for use in operating devices of domestic appliances, such as cookers or stoves, glass ceramic hobs or cook tops, microwave ovens and the like, in which the momentary-contact switch, in order to ensure that it can be operated in a simple manner and that the appliance can also be cleaned, is accommodated behind a covering, such as a glass plate or glass ceramic plate, for example.

Furthermore, German Utility Model DE 202 15 326 U1, owned by the corporate assignee of the instant application, describes a touch-sensitive momentary-contact switch that additionally has a signalling luminaire that can indicate to the user e.g. operational readiness or that operation of the momentary-contact switch has been effected.

German Patent DE 10 2004 025 878 B4, corresponding to U.S. Pat. No. 7,355,164, discloses a touch-sensitive momentary-contact switch having two light-guiding elements. The light-guiding elements guide infrared radiation from the transmitter to the reflection area and on to the receiver. In addition, visible light proceeding from a signal element is coupled into both light-guiding elements and the momentary-contact switch is illuminated. Since two illuminated fields are present per momentary-contact switch and a separating line is visible between the two light-guiding elements, the operator's aesthetic perception is disturbed and it is irritating or distracting for the operator.

German Published, Non-Prosecuted Patent Application DE 198 51 505 A1 discloses a signalling luminaire having only a single light-guiding element. Both visible and infrared light are radiated into the light-guiding element. What is disadvantageous about that configuration, however, is that firstly, only a very small field is illuminated with visible light and secondly, switching processes can also be initiated by infrared interference radiation, such as incorrectly guided reflections for example, and the switching behavior is therefore unreliable.

SUMMARY OF THE INVENTION

It is accordingly an object of the invention to provide a touch-sensitive momentary-contact switch and an operating device having at least one touch-sensitive momentary-contact switch, which overcome the hereinafore-mentioned disadvantages of the heretofore-known devices of this general type and which, firstly, have a single, continuously illuminated operating area and, secondly, ensure a reliable switching behavior that cannot be initiated by interference signals.

With the foregoing and other objects in view there is provided, in accordance with the invention, a touch-sensitive momentary-contact switch, comprising an infrared-radiation-emitting transmitter, an infrared-radiation-receiving receiver, at least one visible-light-emitting signal element, and a single light-guiding element into which the transmitter, the receiver and the signal element radiate. The light-guiding element has a transmission channel, a reception channel and a top-side area remote from the transmitter and the receiver. The light-guiding element effects a separation of the transmission channel and the reception channel in the light-guiding element due to optical beam guidance, to produce a superimposition of a region to be irradiated by the transmitter and a region to be detected by the receiver only on a small portion or proportion of the top-side area.

In other words, the touch-sensitive momentary-contact switch has a single light-guiding element into which, firstly, visible light emitted by a signal element is radiated and, secondly, infrared radiation emitted by a transmitter is coupled, the reflected components of which are guided in the light-guiding element to the infrared-radiation-receiving receiver. In order to avoid interference signals, the light-guiding element has a separation of the transmission channel and the reception channel due to optical beam guidance. As a result of the separation of the transmission and reception channels in the light-guiding element, on the top-side area of the light-guiding element remote from the transmitter and the receiver, a superimposition of transmission and reception channels is produced on only a small portion or proportion of the area.

In accordance with another feature of the invention, the device for optical beam guidance for the transmitter, receiver and signal element is formed in each case by a round or angular column formed at the bottom-side area of the light-guiding element facing the transmitter, receiver and signal element.

The devices for optical beam guidance are provided at the bottom-side area of the light-guiding element facing the transmitter, receiver and signal element. The devices for optical beam guidance are in each case a column assigned to the transmitter, to the receiver and to the signal element, wherein the columns are configured in round or angular fashion.

In accordance with a further feature of the invention, the device for optical beam guidance is integrated in the light-guiding element. This measure results in a particularly robust light-guiding element. The device for optical beam guidance can be enclosed by the light-guiding element, on one hand, and can be placed onto the light-guiding element on the other hand. In a particularly advantageous manner for simplifying the assembly complexity and for reducing the costs, the light-guiding element and device for optical beam guidance are embodied as one component.

In accordance with an added feature of the invention, the device for optical beam guidance in the light-guiding element is formed by a groove running in ring-shaped or annular fashion around the coupling-in area of the signal element in the light-guiding element, or by a straight or curved groove between the coupling-in areas of the transmitter and signal element and by a straight or curved groove between the coupling-in areas of the signal element and receiver.

The device for optical beam guidance in the light-guiding element can enclose the coupling-in area of the signal element in the form of a ring-shaped groove. What is particularly advantageous about this configuration is the screening of the coupling-in area of the signal element against infrared radiation. As an alternative, a groove of straight or curved configuration can run between the coupling-in areas of the transmitter and signal element. In addition to this first groove, a second straight or curved groove can be present between the coupling-in areas of the signal element and receiver in the light-guiding element. What is particularly advantageous about the differing configuration of the groove is the possibility of influencing the optical beam guidance.

In accordance with an additional feature of the invention, the side of the groove remote from the mid-perpendicular of the light-guiding element runs in inclined fashion towards the mid-perpendicular. What is particularly advantageous about the inclination of that side of the groove which is remote from the mid-perpendicular of the light-guiding element is that the lateral propagation of the transmission and/or reception channel in the light-guiding element is adjustable through the use of the inclination angle.

In accordance with yet another feature of the invention, the side of the groove facing the mid-perpendicular of the light-guiding element runs in inclined fashion away from the mid-perpendicular. The inclination of that side of the groove which faces the mid-perpendicular of the light-guiding element away from the mid-perpendicular ensures that the lateral propagation of the visible light in the light-guiding element and hence the extent of the area of the light-guiding element illuminated by visible light are adjustable.

In accordance with yet a further feature of the invention, the optical beam guidance outside the light-guiding element is effected by a configuration of the transmitter, receiver and signal element at different distances from the light-guiding element. In an advantageous manner, different distances of the transmitter, receiver and signal element from the light-guiding element make it possible to establish different diameters of the radiation lobes and thereby to bring about the separation of transmission and reception channels as well as the illuminated portion or proportion of the light-guiding element.

In accordance with yet an added feature of the invention, the light-guiding element has an angular or round cross section and runs conically or in wedge-shaped fashion between the bottom-side area and the top-side area. In the case of a round or angular cross section of the light-guiding element, a conical or wedge-shaped configuration between the bottom-side and the top-side area of the light-guiding element ensures that there is a homogeneous radiation distribution of infrared and visible light in the light-guiding element. What is more, conical or wedge-shaped light-guiding elements can be assembled in a particularly simple manner and are fixed reversibly in a correspondingly adapted holding frame.

In accordance with yet an additional feature of the invention, the portion or proportion of the area of the light-guiding element on which the superimposition of the region that can be irradiated by the transmitter and the region that can be detected by the receiver is possible is between 0 and at most 40% and preferably is between 0 and at most 20%.

It is particularly advantageous if the superimposition of transmission and reception channels with respect to the portion or proportion of the area of the light-guiding element is between 0 and at most 40%. This prevents interference signals from being detected as switching events. In addition to this, the signal-to-noise ratio is optimized if the superimposed portion or proportion of the area of the light-guiding element is between 0 and at most 20%. A portion or proportion of the area of the light-guiding element on which the superimposition of transmission and reception channels is present is optimal if that portion or proportion is between 0 and at most 10%.

With the objects of the invention in view, there is concomitantly provided an operating device for a domestic appliance, comprising at least one touch-sensitive momentary-contact switch according to the invention.

Particularly advantageously, the touch-sensitive momentary-contact switch is disposed behind a covering that is at least partly transmissive to electromagnetic radiation, wherein the covering is integrated into an operating diaphragm. The momentary-contact switch is thereby protected against contamination and mechanical damage. The single light-guiding element is mounted through the use of a mount above a circuit board in such a way that the transmitter, receiver and light signal element can radiate into the light-guiding element. The light-guiding element can be mounted reversibly or permanently in the mount by clamping, insertion, through the use of spring force or adhesive bonding. Firstly, more flexible assembly or better handling is ensured as a result of this and, secondly, it is thereby possible to react to structural requirements.

Other features which are considered as characteristic for the invention are set forth in the appended claims.

Although the invention is illustrated and described herein as embodied in a touch-sensitive momentary-contact switch and an operating device having at least one touch-sensitive momentary-contact switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
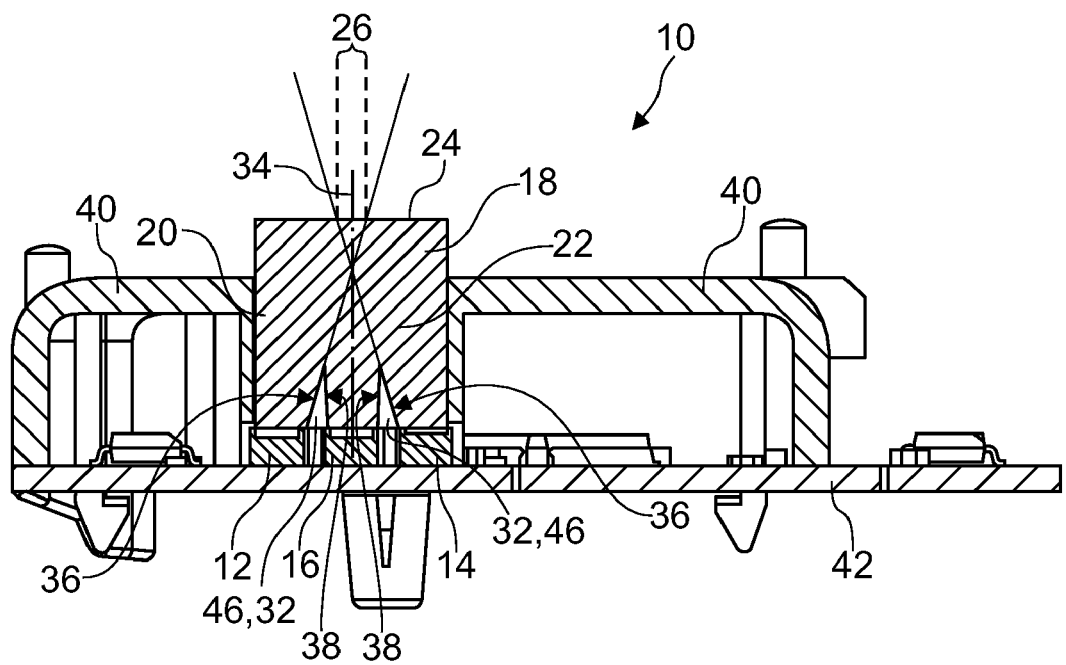
FIG. 1 is a diagrammatic, cross-sectional view of a mounted first light-guiding element.

Referring now in detail to the figures of the drawings, in which identical reference symbols designate identical components in all of the figures, and first, particularly, to FIG. 1 thereof, there is seen a diagrammatic, cross-sectional view of a touch-sensitive momentary-contact switch 10 having a light-guiding element 18 mounted in a mount 40 above a circuit board 42. Alongside further electronic components, the circuit board 42 carries, in the form of SMD components, a transmitter 12, a signal element 16 and a receiver 14. The transmitter 12 radiates infrared radiation into the light-guiding element 18 through a coupling-in area of the light-guiding element 18. The radiation is reflected through a coupling-out area of the light-guiding element 18 to the receiver 14. The signal element 16, for example an LED, radiates visible light into the light-guiding element 18.

In this first exemplary embodiment, a ring-shaped groove 32 around the coupling-in area of the signal element 16 in the light-guiding element 18 forms a device for optical beam guidance. A side 36 of the groove 32 remote from a mid-perpendicular 34 of the light-guiding element 18 is inclined towards the mid-perpendicular 34. A separation of a transmission channel 20 from a reception channel 22 is obtained by an inclination of the groove side 36. The inclination angle of the groove side 36 defines a propagation of the transmission channel 20 and reception channel 22 in the direction of the mid-perpendicular 34. The shallower the inclination angle of the groove side 36 is made, the larger the region in which there is a superimposition 26 of the transmission channel 20 and reception channel 22 on a top-side area 24 of the light-guiding element 18 remote from the transmitter 12 and receiver 14.

As an alternative or in addition to the groove side 36 remote from the mid-perpendicular 34, a groove side 38 facing the mid-perpendicular 34 can be configured in inclined fashion. In this case, the inclination of the groove side 38 is preferably inclined away from the mid-perpendicular 34, in such a way that the lateral propagation of the coupled-in visible light from the signal element 16 is predetermined.

Both the ring-shaped groove 32 and a straight or curved groove 46 can be embodied to be inclined on one side or inclined on both sides, that is to say they can have a V-shape.

The mount 40 can be configured in various ways. Thus, the mount 40 can be adapted to the outer form or shape of the light-guiding element 18, in such a way that the light-guiding element 18 is clamped in the mount 40 and thereby fixed. Firstly, the clamping enables simple assembly since the light-guiding element 18 is fixed. Secondly, this type of fixing is a reversible fixing. Further reversible fixing possibilities are simple insertion into the mount 40 or bracing through the use of springs. A rigid fixing of the light-guiding element 18 can be effected by adhesive bonding.

Figure 2:
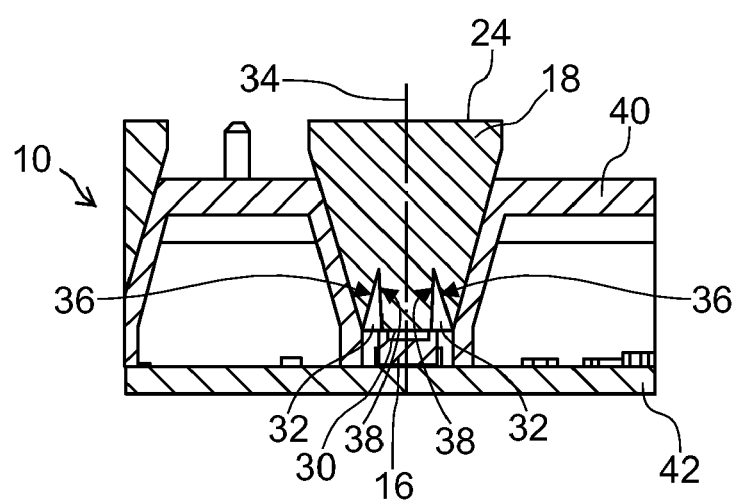
FIG. 2 is a cross-sectional view of a mounted first light-guiding element, which is rotated through 90° relative to FIG. 1.

FIG. 2 is a diagrammatic cross section through a touch-sensitive momentary-contact switch 10. This cross section is rotated through 90° in comparison with FIG. 1. In accordance with the elements described in FIG. 1, FIG. 2 shows an angular light-guiding element 18 that runs in wedge-shaped fashion between its bottom-side and its top-side areas 30, 24 and is mounted through the use of clamping by the mount 40.

Figure 3:
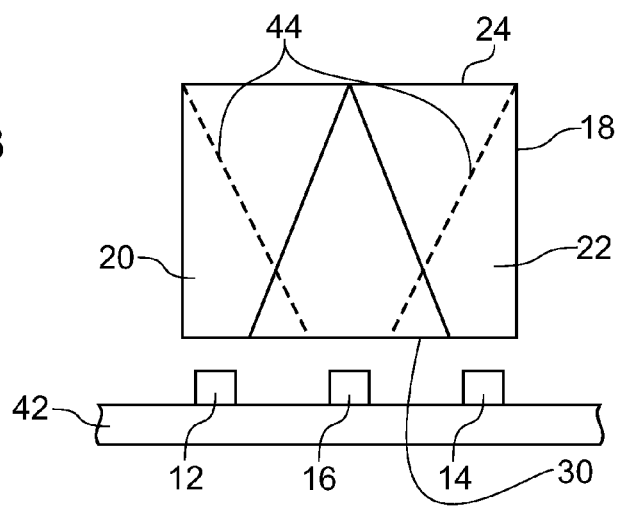
FIG. 3 is a fragmentary, side-elevational view showing separation of transmission and reception channels in a light-guiding element.

FIG. 3 diagrammatically shows an angular light-guiding element 18, which indicates the transmission channel 20 extending from the transmitter 12 and the reception channel 22 extending to the receiver 14 between the bottom-side area 30 and the top-side area 24 of the light-guiding element 18. In the illustrated exemplary case, the proportion of the area of the light-guiding element 18 on which there is a superimposition 26 of the transmission channel 20 and the reception channel 22 is 0%. The transmission channel 20 and reception channel 22 are therefore fully decoupled from one another. In addition to the transmission channel 20 and reception channel 22, an illumination cone 44 formed by the signal element 16 through the use of visible light is indicated by dashed lines. In this configuration, therefore, the complete top-side area 24 the light-guiding element 18 would be illuminated with visible light.

Figure 4:
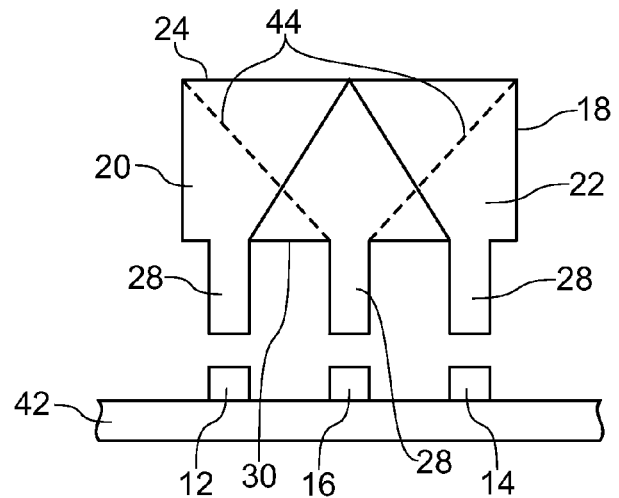
FIG. 4 is a fragmentary, side-elevational view of a second light-guiding element.

FIG. 4 diagrammatically shows an illustration of a light-guiding element 18, which is likewise configured in one part, with three columns 28 having a round cross section formed at the bottom-side area 30 of the element 18 facing the transmitter 12, the receiver 14 and the signal element 16. A respective one of the columns 28 is assigned to each of the transmitter 12, the receiver 14 and the signal element 16. In this case, the columns 28 represent a device for optical beam guidance for the transmitter 12, the receiver 14 and the signal element 16. The columns 28 and the light-guiding element 18 can be formed from one part. However, the columns 28 can also be applied to the bottom-side area 30 of the light-guiding element 18. The transmission channel 20 and the reception channel 22 as well as the light cone 44, are furthermore indicated.

Figure 5:
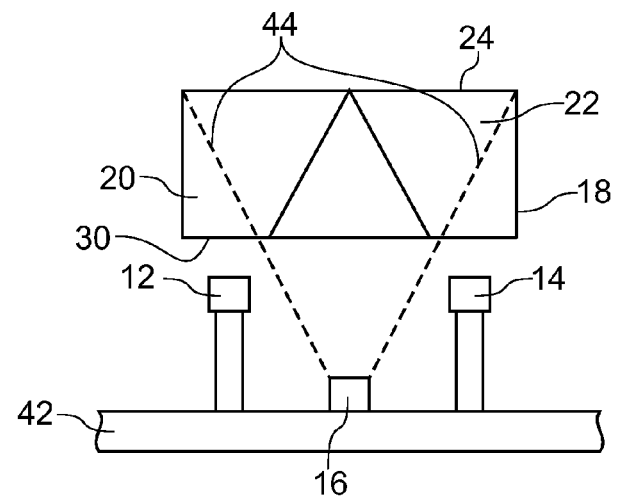
FIG. 5 is a fragmentary, side-elevational view of a third light-guiding element.

FIG. 5 shows a third exemplary embodiment of the present invention. In this case, the optical device for beam guidance for the transmitter 12, the receiver 14 and the signal element 16 is formed by the fact that the transmitter 12, the receiver 14 and the signal element 16 are disposed at different distances from the light-guiding element 18 on the circuit board 42. What is achieved by the different distance of the transmitter 12 and the receiver 14 from the signal element 18 by comparison with the distance of the signal element 16 from the signal element 18, as illustrated in FIG. 5, is that the propagation lobe of the respectively emitted radiation has a differing width. In this way, it is possible for example to set a narrow transmission channel 20 for infrared radiation and thus also a narrow reception channel 22, whereby the two channels 20, 22 are decoupled from one another. A signal element 16 spaced apart further from the light-guiding element 18 produces a larger-diameter emission lobe for the visible light, in such a way that, for example, the whole top area 24 is illuminated.

For each embodiment, a superimposition 26 of the transmission channel 20 and the reception channel 22 is suitable insofar as the proportion of the area of the superimposition 26 is between 0% and at most 40% of the top-side area 24 of the light-guiding element 18. In one preferred configuration, the proportion of the area of the light-guiding element 18 on which a superimposition 26 of the transmission channel 20 and the reception channel 22 occurs is between 0% and at most 20%. The proportion of the area of the light-guiding element 18 in which a superimposition 26 takes place is optimally restricted to between 0% and at most 10%.

The transmitter 12, the receiver 14 and the signal element 16 are preferably SMD components fitted on a circuit board 42. The signal element 16 is preferably an LED. Operating devices including momentary-contact switches 10 of this type are suitable for all electronic apparatuses, but preferably domestic appliances.

The invention claimed is:

1. A touch-sensitive momentary-contact switch, comprising:
   an infrared-radiation-emitting transmitter;
   an infrared-radiation-receiving receiver;
   at least one visible-light-emitting signal element;

a single light-guiding element into which said transmitter and said signal element radiate and from which said receiver receives, said light-guiding element having a bottom-side area facing said transmitter, said receiver and said signal element;

said light-guiding element having a transmission channel, a reception channel and a top-side area remote from said transmitter and said receiver;

said light-guiding element effecting a separation of said transmission channel and said reception channel in said light-guiding element due to optical beam guidance, to produce a superimposition of a region to be irradiated by said transmitter and a region to be detected by said receiver only on a portion of said top-side area; and devices for optical beam guidance for said transmitter, said receiver and said signal element each being formed by a respective round or angular column at said bottom-side area.

2. The momentary-contact switch according to claim 1, wherein said transmitter, said receiver and said signal element are disposed at different distances from said light-guiding element, effecting said optical beam guidance outside said light-guiding element.

3. The momentary-contact switch according to claim 1, wherein said light-guiding element has an angular or round cross section and runs conically or in a wedge-shaped manner between said bottom-side area and said top-side area.

4. The momentary-contact switch according to claim 1, wherein said portion of said top-side area of said light-guiding element on which said superimposition of said region to be irradiated by said transmitter and said region to be detected by said receiver is possible is at most 40%.

5. The momentary-contact switch according to claim 1, wherein said portion of said top-side area of said light-guiding element on which said superimposition of said region to be irradiated by said transmitter and said region to be detected by said receiver is possible is at most 20%.

6. An operating device for a domestic appliance, comprising at least one touch-sensitive momentary-contact switch according to claim 1.

7. A touch-sensitive momentary-contact switch, comprising:
an infrared-radiation-emitting transmitter;
an infrared-radiation-receiving receiver;
at least one visible-light-emitting signal element;
a single light-guiding element into which said transmitter and said signal element radiate and from which said receiver receives;
said light-guiding element having a transmission channel, a reception channel and a top-side area remote from said transmitter and said receiver;
said light-guiding element effecting a separation of said transmission channel and said reception channel in said light-guiding element due to optical beam guidance, to produce a superimposition of a region to be irradiated by said transmitter and a region to be detected by said receiver only on a portion of said too-side area;

said signal element in said light-guiding element having a coupling-in area; and a device for optical beam guidance being integrated in said light-guiding element and formed by a groove running in a ring-shaped manner around said coupling-in area of said signal element in said light-guiding element.

8. The momentary-contact switch according to claim 7, wherein said light-guiding element has a mid-perpendicular, and said groove has a side remote from said mid-perpendicular running in an inclined manner towards said mid-perpendicular.

9. The momentary-contact switch according to claim 8, wherein said groove has a side facing said mid-perpendicular running in an inclined manner away from said mid-perpendicular.

10. A touch-sensitive momentary-contact switch, comprising:
an infrared-radiation-emitting transmitter;
an infrared-radiation-receiving receiver;
at least one visible-light-emitting signal element;
a single light-guiding element into which said transmitter and said signal element radiate and from which said receiver receives;
said light-guiding element having a transmission channel, a reception channel and a top-side area remote from said transmitter and said receiver;
said light-guiding element effecting a separation of said transmission channel and said reception channel in said light-guiding element due to optical beam guidance, to produce a superimposition of a region to be irradiated by said transmitter and a region to be detected by said receiver only on a portion of said top-side area;
a device for optical beam guidance integrated in said light-guiding element;
said transmitter, said receiver and said signal element having coupling-in areas; and
said device for optical beam guidance in said light-guiding element being formed by a straight or curved groove between said coupling-in areas of said transmitter and said signal element and by a straight or curved groove between said coupling-in areas of said signal element and said receiver.

11. The momentary-contact switch according to claim 10, wherein said light-guiding element has a mid-perpendicular, and said grooves have a side remote from said mid-perpendicular running in an inclined manner towards said mid-perpendicular.

12. The momentary-contact switch according to claim 11, wherein said grooves have a side facing said mid-perpendicular running in an inclined manner away from said mid-perpendicular.

* * * * *